United States Patent
Osawa et al.

(10) Patent No.: US 10,119,878 B2
(45) Date of Patent: Nov. 6, 2018

(54) OIL-PRESSURE-SENSOR ATTACHMENT STRUCTURE

(71) Applicant: Nidec Tosok Corporation, Zama-shi, Kanagawa (JP)

(72) Inventors: Tomoka Osawa, Zama (JP); Hironobu Wakabayashi, Zama (JP); Toshiaki Nakamura, Zama (JP); Hiroshi Tatsuta, Zama (JP); Kenichi Ozawa, Kyoto (JP)

(73) Assignee: NIDEC TOSOK CORPORATION, Kanagawa (JP)

( * ) Notice: Subject to any disclaimer, the term of this patent is extended or adjusted under 35 U.S.C. 154(b) by 0 days.

(21) Appl. No.: 15/713,760

(22) Filed: Sep. 25, 2017

(65) Prior Publication Data

US 2018/0087991 A1 Mar. 29, 2018

(30) Foreign Application Priority Data

Sep. 26, 2016 (JP) .................. 2016-187210

(51) Int. Cl.
*G01L 19/00* (2006.01)
*G01L 19/14* (2006.01)

(52) U.S. Cl.
CPC ........ *G01L 19/147* (2013.01); *G01L 19/0069* (2013.01); *G01L 19/143* (2013.01); *B81B 2201/0264* (2013.01)

(58) Field of Classification Search
CPC . G01L 19/147; G01L 19/0069; G01L 19/143; B81B 2201/0264
See application file for complete search history.

(56) References Cited

U.S. PATENT DOCUMENTS

| 7,152,483 B2* | 12/2006 | Mast ................... G01L 19/0084 73/754 |
| 2002/0124655 A1* | 9/2002 | Babala ................. B60T 8/3675 73/715 |
| 2006/0213276 A1* | 9/2006 | Ueyanagi ............ G01L 19/0084 73/754 |
| 2010/0186830 A1 | 7/2010 | Shigyo et al. |
| 2015/0137281 A1 | 5/2015 | Imai et al. |

(Continued)

FOREIGN PATENT DOCUMENTS

| JP | 2010-174991 A | 8/2010 |
| JP | 2015-096843 A | 5/2015 |

*Primary Examiner* — Ryan D Walsh
(74) *Attorney, Agent, or Firm* — Keating & Bennett, LLP

(57) ABSTRACT

In an oil-pressure-sensor attachment structure according to an aspect of the invention, an oil channel body includes a lower body and an upper body arranged at an upper side of the lower body in a superposed manner. The attachment structure includes the upper body, a sensor case, and a connection member including an electrical connection portion that electrically connects an external power supply with a sensor main body. The connection member contacts the upper body from the upper side. The upper body has a through hole in an up-down direction. The sensor case includes a columnar portion that extends in the up-down direction and is inserted into the through hole, a flange portion that protrudes outward in the radial direction from the columnar portion and is arranged to face the lower side of the upper body, and a first hook portion that is hooked to the connection member.

6 Claims, 4 Drawing Sheets

(56) References Cited

U.S. PATENT DOCUMENTS

| | | | | |
|---|---|---|---|---|
| 2017/0315011 A1* | 11/2017 | Osawa | ................ | G01L 19/147 |
| 2018/0023469 A1* | 1/2018 | Osawa | ................ | F02B 77/082 |
| | | | | 180/441 |
| 2018/0038770 A1* | 2/2018 | Osawa | ................ | G01M 13/02 |
| 2018/0057355 A1* | 3/2018 | Osawa | ................ | B81B 7/0051 |
| 2018/0087990 A1* | 3/2018 | Osawa | ................ | G01L 19/143 |
| 2018/0087992 A1* | 3/2018 | Osawa | ................ | F15B 13/042 |
| 2018/0143093 A1* | 5/2018 | Osawa | ................ | G01L 19/003 |
| 2018/0149539 A1* | 5/2018 | Osawa | ................ | G01L 19/144 |

* cited by examiner

OIL-PRESSURE-SENSOR ATTACHMENT STRUCTURE

CROSS REFERENCE TO RELATED APPLICATIONS

This application claims the benefit of priority to Japanese Patent Application No. 2016-187210 filed on Sep. 26, 2016. The entire contents of this application are hereby incorporated herein by reference.

BACKGROUND OF THE INVENTION

1. Field of the Invention

The present invention relates to an oil-pressure-sensor attachment structure.

2. Description of the Related Art

There is known an oil pressure control device including an oil pressure sensor.

An oil pressure sensor is attached to a control valve having an oil channel, for example, as described in Japanese Unexamined Patent Application Publication No. 2010-174991.

Such an oil pressure sensor may be attached to the control valve by a method of disposing the oil pressure sensor between two oil channel bodies included in the control valve. When such a method is used, for example, the oil pressure sensor is inserted into a through hole provided at upper one of the oil channel bodies, then lower one of the oil channel bodies is fixed to a lower surface of the upper oil channel body, and hence the oil pressure sensor is disposed between the upper and lower oil channel bodies. In this case, the oil pressure sensor inserted into the through hole of the upper oil channel body has occasionally fallen during fixing of the lower oil channel body to the upper oil channel body. Hence, the upper oil channel body has had to be turned upside down and then the lower oil channel body has had to be fixed. Therefore, the attachment of the oil pressure sensor has been troublesome work, and ease of assembly of the oil pressure control device has been decreased.

In light of the above-described problems, it is an object of the present invention to provide an oil-pressure-sensor attachment structure capable of preventing an oil pressure sensor from falling during attachment of the oil pressure sensor and increasing ease of assembly.

SUMMARY OF THE INVENTION

An oil-pressure-sensor attachment structure according to an aspect of the invention is for attaching an oil pressure sensor to an oil channel body having therein an oil channel through which oil flows, the oil pressure sensor configured to measure a pressure of the oil flowing through the oil channel. The oil channel body includes a lower body, and an upper body that is arranged at an upper side of the lower body in a superposed manner. The lower body has an oil channel opening that is provided at an upper surface of the lower body and communicates with the oil channel. The oil pressure sensor includes a sensor main body, and a sensor case that covers the sensor main body. The sensor case is configured to be placed on the upper surface of the lower body, and has a sensing hole at a lower surface of the sensor case, the sensing hole communicating with the oil channel opening in a state in which the sensor case is placed on the upper surface of the lower body. The oil-pressure-sensor attachment structure includes the upper body; the sensor case; and a connection member including an electrical connection portion that electrically connects an external power supply with the sensor main body. The contact member contacts the upper body from an upper side. The upper body has a through hole penetrating through the upper body in an up-down direction. The sensor case includes a columnar portion that extends in the up-down direction and is inserted into the through hole, a flange portion that protrudes outward in a radial direction from the columnar portion and is arranged to face a lower side of the upper body, and a first hook portion that is hooked to the connection member.

The above and other elements, features, steps, characteristics and advantages of the present invention will become more apparent from the following detailed description of the preferred embodiments with reference to the attached drawings.

BRIEF DESCRIPTION OF THE DRAWINGS

Embodiments will now be described, by way of example only, with reference to the accompanying drawings which are meant to be exemplary, not limiting, and wherein like elements are numbered alike in several Figures, in which.

DETAILED DESCRIPTION OF THE PREFERRED EMBODIMENTS

In each drawing, it is assumed that the Z-axis direction is an up-down direction Z. The positive side in the up-down direction Z is called "upper side," and the negative side is called "lower side." It is to be noted that the upper side, lower side, and up-down direction are merely names for explaining the relative positional relationship among respective parts, and it is not intended to limit the actual arrangement relationship and so forth.

Figure 1:
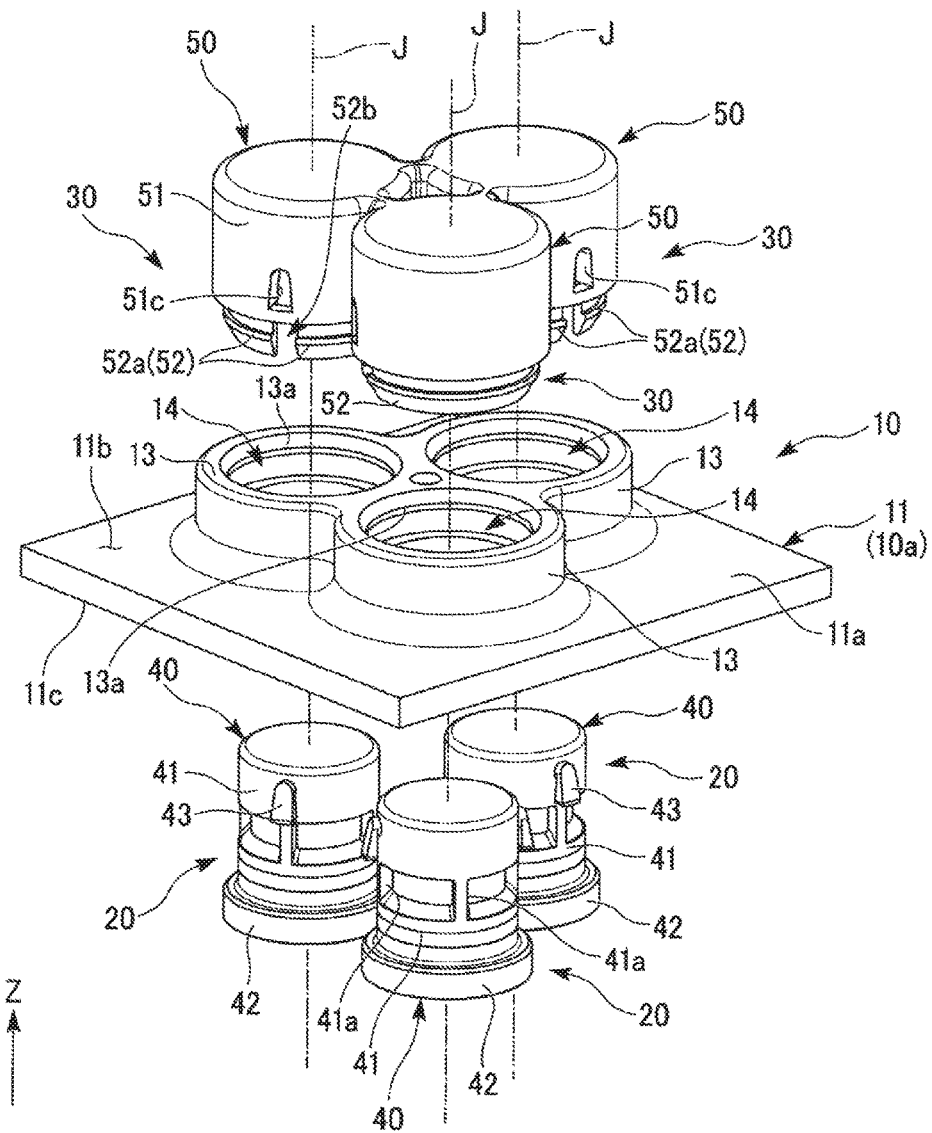
FIG. 1 is a perspective view illustrating an oil-pressure-sensor attachment structure according to an embodiment.
Figure 2:
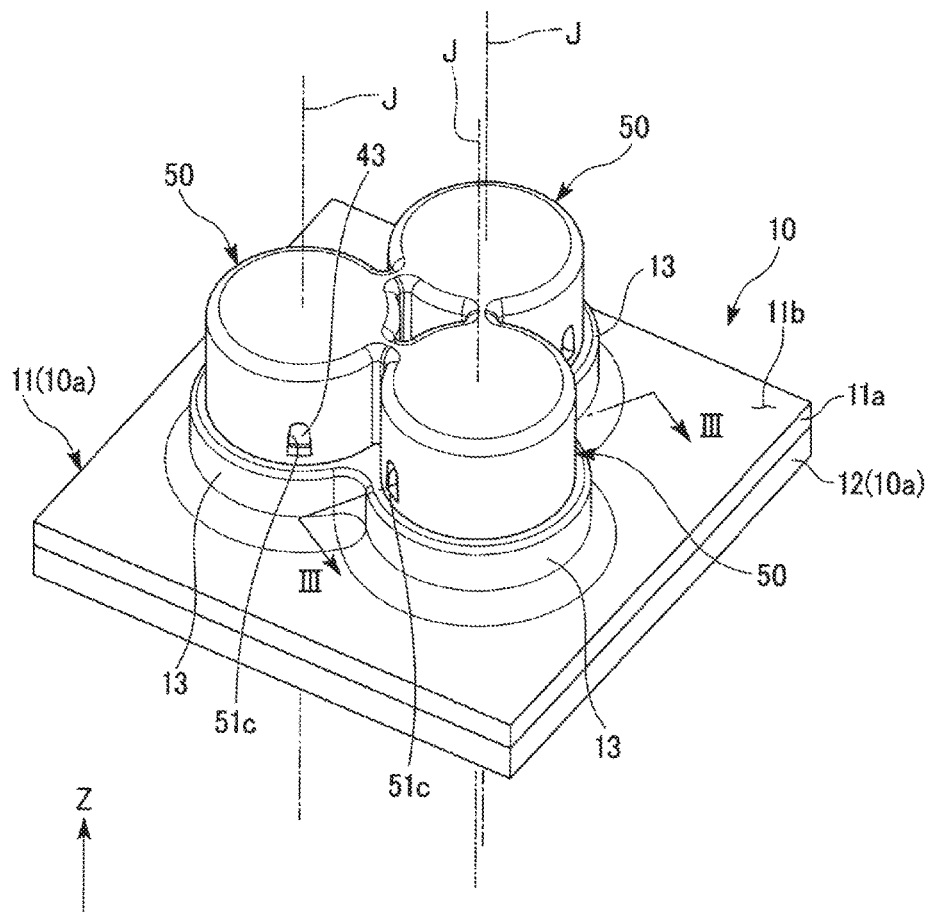
FIG. 2 is a perspective view illustrating the oil-pressure-sensor attachment structure according to the embodiment.
Figure 3:
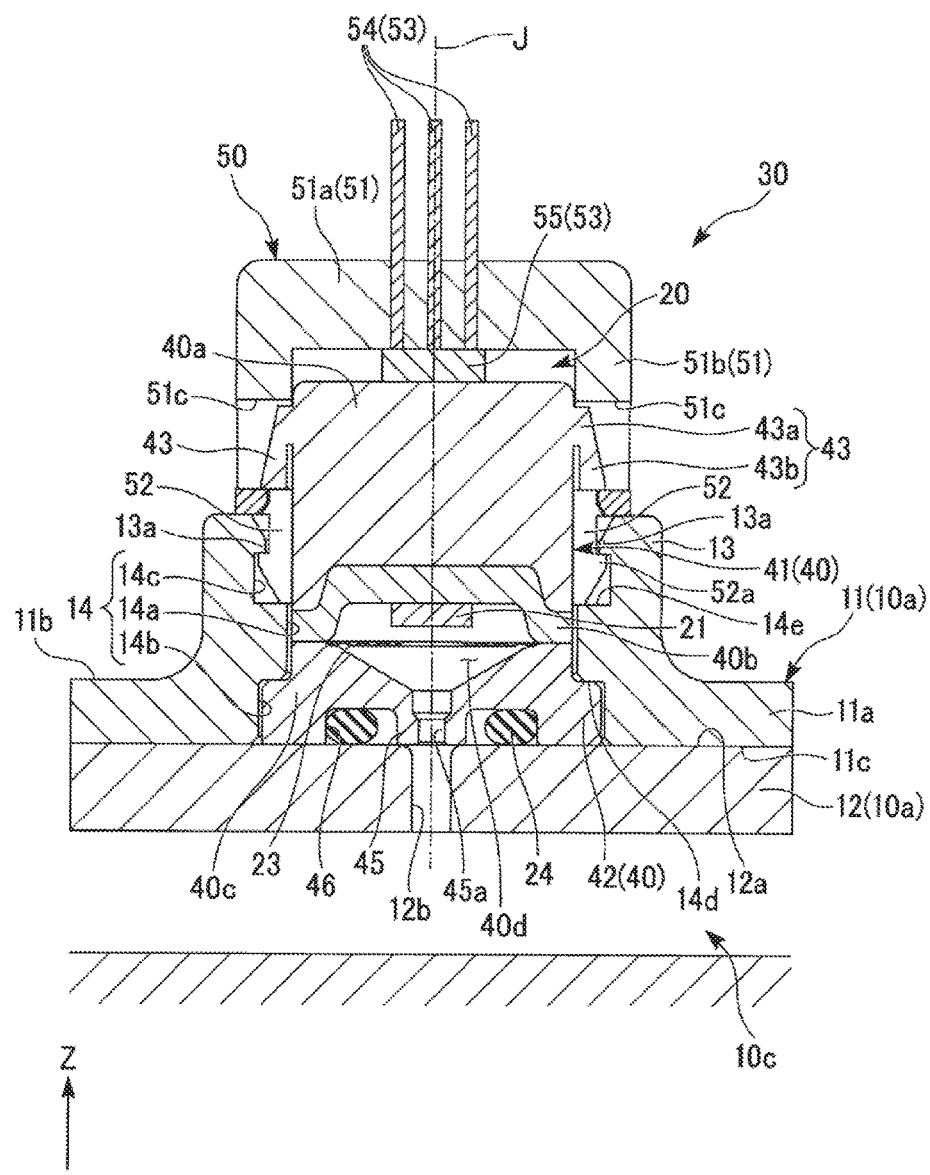
FIG. 3 is a cross-sectional view, taken along line III-III in FIG. 2, illustrating the oil-pressure-sensor attachment structure according to the embodiment.

An oil-pressure-sensor attachment structure 30 according to an embodiment illustrated in FIGS. 1 to 4 attaches an oil pressure sensor 20 to an oil channel body 10*a* of a control valve 10 of an oil pressure control device. As illustrated in FIG. 3, the oil channel body 10*a* has therein an oil channel 10*c* through which oil flows. The oil pressure sensor 20 measures the pressure of the oil flowing through the oil channel 10*c*. The oil channel body 10*a* includes a lower body 12 and an upper body 11 arranged at the upper side of the lower body 12 in a superposed manner. The lower body 12 has an oil channel opening 12*b* at an upper surface 12*a* of the lower body 12. The oil channel opening 12*b* communicates with the oil channel 10*c*. In this embodiment, the oil channel opening 12*b* has a circular shape centered on a central axis J extending in the up-down direction Z. In the following description, a radial direction centered on the central axis J is merely called "radial direction," and a circumferential direction centered on the central axis J is merely called "circumferential direction."

Figure 4:
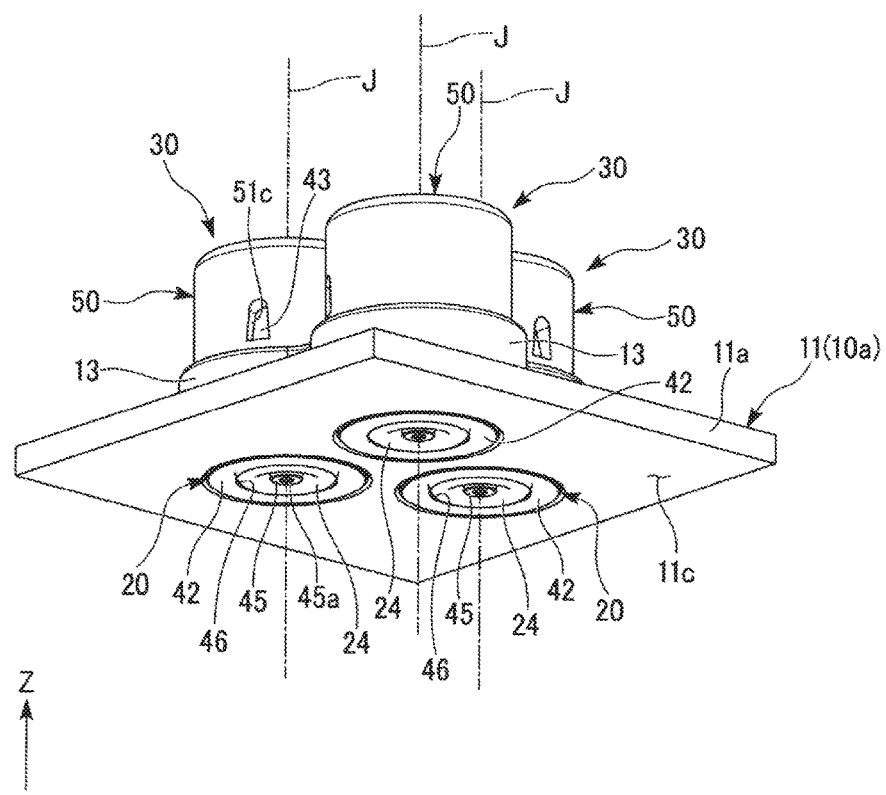
FIG. 4 is a perspective view illustrating the oil-pressure-sensor attachment structure according to the embodiment.

FIGS. 1 and 4 illustrate a state before the oil pressure sensor 20 is attached to the oil channel body 10a. To be more specific, FIG. 1 illustrates a state before the oil pressure sensor 20 is held by the upper body 11. FIG. 4 illustrates a state after the oil pressure sensor 20 is held by the upper body 11 and before the lower body 12 is fixed to the upper body 11. FIGS. 2 and 3 illustrate a state in which the oil pressure sensor 20 is attached to the oil channel body 10a by the oil-pressure-sensor attachment structure 30. It is to be noted that the state in which the oil pressure sensor 20 is attached to the oil channel body 10a by the oil-pressure-sensor attachment structure 30 is called "attached state."

As illustrated in FIGS. 1 and 2, in this embodiment, three oil-pressure-sensor attachment structures 30 are provided as a group. The oil-pressure-sensor attachment structures 30 each include the upper body 11, a sensor case 40 of the oil pressure sensor 20, and a connection member 50.

As illustrated in FIG. 1, the upper body 11 includes an upper body main portion 11a and a protruding tubular portion 13. The upper body main portion 11a is a plate-shaped portion. The protruding tubular portion 13 is a tubular portion protruding to the upper side from an upper surface 11b of the upper body main portion 11a. The protruding tubular portion 13 has a circular tubular shape centered on the central axis J and being open to both sides in the up-down direction Z. The protruding tubular portion 13 is provided for each oil-pressure-sensor attachment structure 30. In this embodiment, the protruding tubular portions 13 of the three oil-pressure-sensor attachment structures 30 are coupled to one another.

The upper body 11 has a through hole 14 penetrating through the upper body 11 in the up-down direction Z. As illustrated in FIG. 3, the through hole 14 penetrates through the upper body main portion 11a and the protruding tubular portion 13 in the up-down direction Z. An inner surface in the radial direction of the through hole 14 is formed of an inner surface in the radial direction of the protruding tubular portion 13 and an inner surface in the radial direction of a hole penetrating through the upper body main portion 11a in the up-down direction Z. The through hole 14 has a small-diameter portion 14a, a lower large-diameter portion (large-diameter portion) 14b, and an upper large-diameter portion 14c.

A columnar portion 41 (described later) of the sensor case 40 is inserted into the small-diameter portion 14a in the attached state. The inner diameter of the small-diameter portion 14a is substantially equivalent to the inner diameter of the columnar portion 41. The lower large-diameter portion 14b is connected to a lower end of the small-diameter portion 14a. The inner diameter of the lower large-diameter portion 14b is larger than the inner diameter of the small-diameter portion 14a. The lower large-diameter portion 14b is a lower end portion of the through hole 14 and is open to the lower side. The upper large-diameter portion 14c is connected to an upper end of the small-diameter portion 14a. The inner diameter of the upper large-diameter portion 14c is larger than the inner diameter of the small-diameter portion 14a. The inner diameter of the upper large-diameter portion 14c is substantially equivalent to the inner diameter of the lower large-diameter portion 14b. In this embodiment, the inner diameter of the upper large-diameter portion 14c is slightly larger than the inner diameter of the lower large-diameter portion 14b. The upper large-diameter portion 14c is an upper end portion of the through hole 14 and is open to the upper side. The upper opening of the upper large-diameter portion 14c is an upper opening of the protruding tubular portion 13. In this embodiment, the small-diameter portion 14a and the upper large-diameter portion 14c are portions provided at the protruding tubular portion 13. In this embodiment, the lower large-diameter portion 14b is a portion provided at the upper body main portion 11a.

The small-diameter portion 14a and the lower large-diameter portion 14b form a step at the inner surface in the radial direction of the through hole 14. At the step, the inner diameter of the through hole 14 decreases from the lower side to the upper side. The step has a step surface 14d facing the lower side and having a circular ring-like shape. The step surface 14d is a flat surface orthogonal to the up-down direction Z. Also, the small-diameter portion 14a and the upper large-diameter portion 14c form a step at the inner surface in the radial direction of the through hole 14. At the step, the inner diameter of the through hole 14 increases from the lower side to the upper side. The step has a step surface 14e facing the upper side and having a circular ring-like shape. The step surface 14e is a flat surface orthogonal to the up-down direction Z.

The upper body 11 has a protrusion 13a that protrudes inward in the radial direction from the inner surface in the radial direction of the through hole 14. In this embodiment, the protrusion 13a protrudes inward in the radial direction from an inner surface in the radial direction of the upper large-diameter portion 14c. That is, the protrusion 13a protrudes inward in the radial direction from an inner surface in the radial direction of an upper end portion of the protruding tubular portion 13. As illustrated in FIG. 1, the protrusion 13a is a circular ring-shaped portion extending along one turn in the circumferential direction at the inner surface in the radial direction of the through hole 14.

As illustrated in FIG. 3, the oil pressure sensor 20 includes the sensor case 40, a sensor main body 21, a diaphragm 23, and an O-ring 24. The sensor case 40 covers the sensor main body 21. The sensor case 40 is placed on the upper surface 12a of the lower body 12 in the attached state. As illustrated in FIG. 1, the sensor case 40 includes the columnar portion 41, a flange portion 42, and a first hook portion 43.

The columnar portion 41 extends in the up-down direction Z. In this embodiment, the shape of the columnar portion 41 is a circular columnar shape extending in the up-down direction Z. The columnar portion 41 is arranged to be centered on the central axis J in the attached state. The description on respective parts of the oil pressure sensor 20 is given for the case where the columnar portion 41 is arranged to be centered on the central axis J. The columnar portion 41 has a groove portion 41a at an outer peripheral surface of the columnar portion 41. The groove portion 41a is recessed inward in the radial direction. The groove portion 41a extends in the circumferential direction. A plurality of the groove portions 41a are provided in the circumferential direction. The columnar portion 41 is inserted into the through hole 14 in the attached state.

As illustrated in FIGS. 3 and 4, the columnar portion 41 has a ring-shaped seal groove portion 46 recessed to the upper side from a lower surface of the columnar portion 41. The seal groove portion 46 has a circular ring-like shape centered on the central axis J. Since the seal groove portion 46 is provided, a protruding portion 45 is provided at the inner side of the seal groove portion 46. The protruding portion 45 protrudes to the lower side. The protruding portion 45 has a sensing hole 45a recessed to the upper side from a lower surface of the protruding portion 45 and communicating with a housing space 40d (described later). That is, the sensor case 40 has the sensing hole 45a at a lower surface of the sensor case 40. As illustrated in FIG. 3, the sensing hole 45a communicates with the oil channel opening 12b in the state in which the sensor case 40 is placed on the upper surface 12a of the lower body 12. The O-ring 24 is arranged in the seal groove portion 46. The O-ring 24 provides sealing between the upper surface 12a of the lower body 12 and the sensor case 40.

As illustrated in FIG. 1, the flange portion 42 protrudes outward in the radial direction from the columnar portion 41. In this embodiment, the flange portion 42 is provided at a lower end portion of the columnar portion 41. The flange portion 42 has a circular ring-like shape surrounding the columnar portion 41 in the circumferential direction.

The first hook portion 43 is a portion that is hooked to the connection member 50. In this embodiment, the first hook portion 43 is a claw portion provided at an upper portion of the sensor case 40 and protruding outward in the radial direction. As illustrated in FIG. 3, the first hook portion 43 includes a coupling portion 43a and a first hook main portion 43b. The coupling portion 43a is a portion protruding outward in the radial direction from an upper end portion of the columnar portion 41. The first hook main portion 43b is a portion extending to the lower side from an outer end in the radial direction of the coupling portion 43a. An outer surface in the radial direction of the first hook main portion 43b is an inclined surface inclined outward in the radial direction from the upper side to the lower side. An inner surface in the radial direction of the first hook main portion 43b is a flat surface parallel to the up-down direction Z, and is disposed at the outer side in the radial direction of the outer peripheral surface of the columnar portion 41 with a gap interposed therebetween. In this embodiment, the first hook portion 43 includes two first hook portions 43 provided such that the columnar portion 41 is disposed between the two first hook portions 43 in the radial direction. The first hook portions 43 each are made of, for example, resin.

In this embodiment, the sensor case 40 includes three members including an upper case 40a, a lid portion 40b, and a lower case 40c. The upper case 40a is a portion that forms an upper portion of the columnar portion 41. The first hook portions 43 are provided at the upper case 40a. The upper case 40a is, for example, a single member made of resin. The lower case 40c is a portion that forms a lower portion of the columnar portion 41. The flange portion 42 is provided at the lower case 40c. The lower case 40c is, for example, a single member made of metal. The lid portion 40b is disposed between the upper case 40a and the lower case 40c in the up-down direction Z in a contact manner.

A housing space 40d is provided between the lower case 40c and the lid portion 40b in the up-down direction Z. The housing space 40d is partitioned by the diaphragm 23 in the up-down direction Z. An upper end of the sensing hole 45a is open at a lower portion of the housing space 40d. The sensor main body 21 is placed on a lower surface of the lid portion 40b in an upper portion of the housing space 40d. The upper portion of the housing space 40d is filled with a pressure transmission fluid. In the attached state, oil flows into the lower portion of the housing space 40d through the sensing hole 45a communicating with the oil channel opening 12b. The pressure of the oil flowing into the lower portion of the housing space 40d is applied to the sensor main body 21 via the diaphragm 23 and the pressure transmission fluid. Accordingly, the oil pressure of the oil in the oil channel 10c can be measured by the sensor main body 21.

As illustrated in FIG. 1, the connection member 50 has a tubular shape having a lid and being open to the lower side. To be more specific, the connection member 50 has a circular tubular shape centered on the central axis J. The inner diameter of the connection member 50 is substantially equivalent to the outer diameter of the columnar portion 41 and the inner diameter of the small-diameter portion 14a. The inner diameter of the connection member 50 is slightly larger than the outer diameter of the columnar portion 41. The inner diameter of the connection member is slightly smaller than the inner diameter of the small-diameter portion 14a. In this embodiment, the connection member is provided for each of the oil-pressure-sensor attachment structures 30, and the connection members 50 of the three oil-pressure-sensor attachment structures 30 are coupled to one another. A coupled body in which the three connection members 50 are coupled to one another is, for example, a single member.

The connection members 50 each include a cap portion 51 and an insertion portion 52. As illustrated in FIG. 3, the cap portion 51 includes a lid portion 51a and a tubular portion 51b. The lid portion 51a is provided at an upper end of the tubular portion 51b. The lid portion 51a covers the upper side of the oil pressure sensor 20 in the attached state. The tubular portion 51b has a tubular shape extending in the up-down direction Z. The tubular portion 51b has a hole 51c recessed outward in the radial direction from an inner surface in the radial direction of the tubular portion 51b. That is, the connection member 50 has the hole 51c recessed outward in the radial direction from an inner surface in the radial direction of the connection member 50. In this embodiment, the hole 51c is a hole penetrating through a wall portion of the tubular portion 51b in the radial direction. As illustrated in FIG. 2, the dimension in the circumferential direction of the hole 51c increases from the upper side to the lower side. As illustrated in FIG. 3, the hole 51c in this embodiment is provided at each of both sides of the tubular portion 51b with the central axis J interposed therebetween in the radial direction.

The insertion portion 52 protrudes to the lower side from a lower end of the tubular portion 51b. As illustrated in FIG. 1, the insertion portion 52 extends in the circumferential direction. The insertion portion 52 has a second hook portion 52a protruding outward in the radial direction. That is, the connection member 50 includes the second hook portion 52a. The second hook portion 52a is provided at a lower end portion of the insertion portion 52. That is, the second hook portion 52a is provided at a lower portion of the connection member 50. The second hook portion 52a extends from one end to the other end in the circumferential direction of the insertion portion 52. As illustrated in FIG. 3, the second hook portion 52a in this embodiment is a claw portion that is hooked to the protrusion 13a from the lower side in the attached state.

As illustrated in FIG. 1, the insertion portion 52 in this embodiment includes two insertion portions 52 facing one another with gaps interposed therebetween in the radial direction. Gaps 52b are provided between the insertion portions 52 in the circumferential direction. The gaps 52b are arranged at the same positions as the positions of the holes 51c in the circumferential direction.

As illustrated in FIG. 3, the connection member 50 includes an electrical connection portion 53. The electrical connection portion 53 electrically connects an external power supply (not illustrated) with the sensor main body 21. The electrical connection portion 53 includes a contact terminal 55 and a connection pin 54. The contact terminal 55 is arranged on the lower surface of the lid portion 51a. The contact terminal 55 contacts an upper end of the oil pressure sensor 20 in the attached state. Although not illustrated, a terminal portion that is electrically connected to the sensor main body 21 is provided at the upper end of the oil pressure sensor 20. This terminal portion contacts the contact terminal 55, and hence the contact terminal is electrically connected to the sensor main body 21. The contact terminal 55 is, for example, a spring-shaped terminal.

The connection pin 54 extends to the upper side from the contact terminal 55. The connection pin 54 penetrates through the lid portion 51a in the up-down direction Z. An upper end of the connection pin 54 protrudes to the upper side of the lid portion 51a. The connection pin 54 includes, for example, three connection pins 54. The connection pins 54 are connected to an external power supply (not illustrated). Accordingly, the sensor main body 21 is connected to the external power supply via the connection pins 54 and the contact terminal 55. It is to be noted that FIGS. 1, 2, and 4 omit illustration of the electrical connection portion 53.

First, an attachment worker mounts the connection member with respect to the upper body 11. To be specific, the attachment worker inserts the insertion portions 52 into the through hole 14 from the upper side. Accordingly, as illustrated in FIG. 3, the lower portion of the connection member 50 including the second hook portions 52a is inserted into the through hole 14. When the insertion portions 52 are inserted into the through hole 14 from the upper side, the second hook portions 52a are pressed by the protrusions 13a and elastically deformed inward in the radial direction. Accordingly, the second hook portions 52a are elastically displaced inward in the radial direction. When the second hook portions 52a are inserted to positions lower than the positions of the protrusions 13a, the second hook portions 52a are restored and moved outward in the radial direction, and the elastic deformation of the insertion portions 52 is restored. Accordingly, the second hook portions 52a are hooked to the protrusions 13a from the lower side. That is, the second hook portions 52a are hooked to the inner surface in the radial direction of the through hole 14. At this time, lower ends of the insertion portions 52 face the step surface 14e in the up-down direction Z. A lower end of the tubular portion 51b contacts an upper end of the protruding tubular portion 13. That is, the connection member 50 contacts the upper body 11 from the upper side. Accordingly, the connection member 50 is positioned in the up-down direction Z.

Then, the attachment worker mounts the oil pressure sensor 20 with respect to the upper body 11. To be specific, the attachment worker inserts the upper portion of the columnar portion 41 into the through hole 14 from the lower side. The upper portion of the columnar portion 41, that is, the upper portion of the sensor case 40 is inserted into the connection member 50 via the lower large-diameter portion 14b and the small-diameter portion 14a. The attachment worker pushes the oil pressure sensor 20 into the through hole 14 from the lower side until the flange portion 42 is inserted into the lower large-diameter portion 14b and the upper surface of the flange portion 42 contacts the step surface 14d.

In this case, since the outer diameter of the sensor case 40 is larger than the inner diameter of a lower end portion of the tubular portion 51b at the position at which lower end portions of the first hook main portions 43b are provided, when the first hook portions 43 are inserted into the lower end of the tubular portion 51b, the first hook main portions 43b are pressed by the inner peripheral surface of the tubular portion 51b and are elastically displaced inward in the radial direction. In this state, the oil pressure sensor 20 is further pushed to the upper side. When lower ends of the first hook main portions 43b are located at positions upper than the positions of lower ends of the holes 51c, the first hook main portions 43b are restored and moved outward in the radial direction. Accordingly, the first hook portions 43 are inserted into the holes 51c and hooked to the connection member 50. The lower ends of the first hook main portions 43b contact lower inner surfaces of the holes 51c from the upper side.

As described above, the oil pressure sensor 20 and the connection member 50 are coupled with each other, and the oil pressure sensor 20 is attached to the upper body 11. Since the connection member 50 contacts the upper body 11 from the upper side, the connection member 50 is prevented from moving to the lower side. Hence, the oil pressure sensor 20 coupled with the connection member 50 is also prevented from moving to the lower side. Accordingly, as illustrated in FIG. 4, the oil pressure sensor 20 can be prevented from falling from the upper body 11 without turning the upper body 11 upside down in the state in which the lower body 12 is not attached. The attachment worker can attach the oil pressure sensor 20 to the oil channel body 10a by fixing the lower body 12 to the lower side of the upper body 11 without turning the upper body 11 upside down. Hence, the troublesome work for attaching the oil pressure sensor 20 can be decreased. As the result, according to this embodiment, the oil-pressure-sensor attachment structure 30 capable of preventing the oil pressure sensor 20 from falling during attachment of the oil pressure sensor 20 and increasing ease of assembly of the oil pressure control device can be provided.

As illustrated in FIG. 3, the lower body 12 is fixed to the upper body 11 in the state in which the upper surface 12a of the lower body 12 contacts a lower surface 11c of the upper body 11. The lower surface of the sensor case 40 contacts the upper surface 12a of the lower body 12.

In the state in which the oil pressure sensor 20 is attached to the upper body 11, the flange portion 42 is arranged to face the lower side of the step surface 14d at the step formed of the small-diameter portion 14a and the lower large-diameter portion 14b. In other words, the flange portion 42 is arranged to face the lower side of the upper body 11. Hence, a phenomenon in which the flange portion 42 is hooked to the step surface 14d and the oil pressure sensor 20 moves to the upper side can be restricted. Accordingly, the connection member 50 coupled with the oil pressure sensor 20 can be prevented from moving to the upper side, and the connection member 50 can be prevented from falling from the through hole 14. By using the oil pressure sensor 20, the connection member 50 including the electrical connection portion 53 can be attached to the upper body 11 without using another member. Hence, the number of components can be prevented from increasing, and the manufacturing cost of the oil pressure control device can be decreased.

In this embodiment, the O-ring 24 is elastically deformed in the up-down direction Z in the attached state, and applies an upward force to the sensor case 40. Hence, the flange portion 42 is pressed to the step surface 14d from the lower side.

Also, in this embodiment, since the first hook portions 43 are the claw portions that are hooked to the holes 51c, the oil-pressure-sensor attachment structure 30 can be simplified.

Also, according to this embodiment, since the connection member 50 is hooked to the inner surface in the radial direction of the through hole 14 by the second hook portions 52a, the connection member 50 attached to the upper body 11 can be further reliably prevented from moving to the upper side, and the connection member 50 can be further reliably prevented from falling from the through hole 14. In this embodiment, the second hook portions 52a are the claw portions that are hooked to the protrusions 13a provided at the inner surface in the radial direction of the through hole 14 from the lower side. Accordingly, the oil-pressure-sensor attachment structure 30 can be simplified.

In this embodiment, in the attached state, the upper portion of the sensor case 40 is fitted into the connection member 50, and is arranged in a superposed manner with the second hook portions 52a in the radial direction. Hence, the insertion portions 52 and the second hook portions 52a can be prevented from being elastically deformed inward in the radial direction by the sensor case 40. That is, the oil pressure sensor 20 functions as a stopper for the connection member 50. Accordingly, the second hook portions 52a are prevented from falling from the protrusions 13a, and the connection member 50 can be further tightly attached to the upper body 11.

In this embodiment, since the flange portion 42 is inserted into the lower large-diameter portion 14b, the lower surface 11c of the upper body 11 may be easily flush with the lower surface of the sensor case 40. Accordingly, the lower surface 11c of the upper body 11 is easily aligned with the upper surface 12a of the lower body 12, and the lower body 12 can be easily fixed to the upper body 11.

The present invention is not limited to the above-described embodiment, and may employ other configurations. The oil channel opening 12b may not be located at the position through which the central axis J passes, as long as the oil channel opening 12b communicates with the sensing hole 45a in the attached state. That is, the position of the oil channel opening 12b and the position of the sensing hole 45a may be deviated from the central axis J. Also, the sensor case 40 may be a single member. The connection members 50 may be provided individually in a separated manner. The protruding tubular portions 13 may be provided individually in a separated manner. The protruding tubular portions 13 may not be provided.

The through hole 14 does not have to have the lower large-diameter portion 14b. In this case, for example, a recess recessed to the lower side may be provided at the upper surface 12a of the lower body 12, and the flange portion 42 may be inserted into the recess. The second hook portions 52a may not be provided. The shape of the connection member 50 is not particularly limited as long as the connection member 50 includes the electrical connection portion 53.

The oil channel body to which the oil pressure sensor can be attached with the oil-pressure-sensor attachment structure according to the above-described embodiment is only required to have an oil channel therein through which oil flows. Hence the oil channel body is not particularly limited. The oil-pressure-sensor attachment structure according to the above-described embodiment may be applied to, for example, an attachment structure of an oil pressure sensor for a motor-operated oil pump.

Features of the above-described preferred embodiments and the modifications thereof may be combined appropriately as long as no conflict arises.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An oil-pressure-sensor attachment structure for attaching an oil pressure sensor to an oil channel body having therein an oil channel through which oil flows, the oil pressure sensor configured to measure a pressure of the oil flowing through the oil channel,
   the oil channel body including a lower body, and an upper body that is arranged at an upper side of the lower body in a superposed manner,
   the lower body having an oil channel opening that is provided at an upper surface of the lower body and communicates with the oil channel,
   the oil pressure sensor including a sensor main body, and a sensor case that covers the sensor main body,
   the sensor case configured to be placed on the upper surface of the lower body, and having a sensing hole at a lower surface of the sensor case, the sensing hole communicating with the oil channel opening in a state in which the sensor case is placed on the upper surface of the lower body,
   the oil-pressure-sensor attachment structure comprising:
   the upper body;
   the sensor case; and
   a connection member including an electrical connection portion that electrically connects an external power supply with the sensor main body,
   wherein the contact member contacts the upper body from an upper side of the upper body,
   wherein the upper body has a through hole penetrating through the upper body in an up-down direction, and
   wherein the sensor case includes
      a columnar portion that extends in the up-down direction and is inserted into the through hole,
      a flange portion that protrudes outward in a radial direction from the columnar portion and is arranged to face a lower side of the upper body, and
      a first hook portion that is hooked to the connection member.

2. The oil-pressure-sensor attachment structure according to claim 1,
   wherein the connection member has a tubular shape being open to a lower side of the connection member and has a hole recessed outward in the radial direction from an inner surface in the radial direction of the connection member,
   wherein an upper portion of the sensor case is inserted into the connection member, and
   wherein the first hook portion is a claw portion provided at the upper portion of the sensor case and protruding outward in the radial direction, and is inserted into the hole and hooked to the connection member.

3. The oil-pressure-sensor attachment structure according to claim 1,
   wherein the connection member includes a second hook portion that is inserted into the through hole, and
   wherein the second hook portion is hooked to an inner surface in the radial direction of the through hole.

4. The oil-pressure-sensor attachment structure according to claim 3,
   wherein the upper body includes a protrusion that protrudes inward in the radial direction from the inner surface in the radial direction of the through hole, and
   wherein the second hook portion is a claw portion that protrudes outward in the radial direction and is hooked to the protrusion from a lower side of the protrusion.

5. The oil-pressure-sensor attachment structure according to claim 4,
   wherein the connection member has a tubular shape being open to a lower side of the connection member,
   wherein a lower portion of the connection member is inserted into the through hole, wherein the second hook portion is provided at the lower portion of the connection member, and wherein an upper portion of the sensor case is fitted into the connection member, and is arranged in a superposed manner with the second hook portion in the radial direction.

6. The oil-pressure-sensor attachment structure according to claim 1, wherein the flange portion is provided at a lower end portion of the columnar portion, wherein the through hole has a small-diameter portion into which the columnar portion is inserted, and a large-diameter portion connected to a lower end of the small-diameter portion and having a larger inner diameter than an inner diameter of the small-diameter portion, wherein the flange portion is inserted into the large-diameter portion, and wherein the small-diameter portion and the large diameter portion form a step having a step surface facing a lower side of the step, the flange portion arranged to face a lower side of the step surface.

* * * * *